United States Patent [19]

Kaufman et al.

[11] Patent Number: 5,227,728
[45] Date of Patent: Jul. 13, 1993

[54] GRADIENT DRIVER CONTROL IN MAGNETIC RESONANCE IMAGING

[75] Inventors: Leon Kaufman, San Francisco; Joseph W. Carlson, Kensington, both of Calif.; Richard Gran, Farmingdale, N.Y.

[73] Assignee: The Regents of the University of California, Oakland, Calif.

[21] Appl. No.: 786,828

[22] Filed: Nov. 1, 1991

[51] Int. Cl.$^5$ .............................................. G01V 3/00
[52] U.S. Cl. ..................................... 324/322; 324/318
[58] Field of Search ............... 324/322, 318, 312, 313, 324/319; 128/653.5

[56] References Cited

U.S. PATENT DOCUMENTS

| | | | |
|---|---|---|---|
| 4,612,596 | 9/1986 | Fox | 324/322 |
| 4,703,275 | 10/1987 | Holland | 324/322 |
| 4,755,755 | 7/1988 | Carlson | 324/319 |
| 4,788,502 | 11/1988 | Keller et al. | 324/318 |
| 4,829,252 | 5/1989 | Kaufman | 324/309 |
| 4,885,542 | 12/1989 | Yao et al. | 324/313 |
| 4,928,063 | 5/1990 | Lampman et al. | 324/324 |
| 4,970,457 | 11/1990 | Kaufman et al. | 324/309 |

OTHER PUBLICATIONS

"Passive Screening of Switched Magnetic Field Gradients" by R. Turner et al.-J. Phys. E. Sci., Instrum 19 (1986).

*Primary Examiner*—Louis Arana
*Attorney, Agent, or Firm*—Nixon & Vanderhye

[57] ABSTRACT

Electromagnet coil driving circuitry in a magnetic resonance imaging system is modified to include a flux-driven closed-loop real-time feedback control. The result is more accurate and efficient control of the net actual gradient flux generated by the coil even in the presence of magnetic circuit materials exhibiting hysteresis effects and/or electrical conductors giving rise to eddy current effects. Such driver control can be used to simultaneously correct the magnetic flux changes induced by environmental, ambient or other outside disturbances affecting the net magnetic field within a patient imaging volume of a magnetic resonance imaging system.

31 Claims, 5 Drawing Sheets

GRADIENT DRIVER CONTROL IN MAGNETIC RESONANCE IMAGING

BACKGROUND OF THE INVENTION

This invention relates generally to magnetic resonance imaging (MRI) utilizing nuclear magnetic resonance (NMR) phenomena. It more particularly relates to control of the driver circuits for gradient coils and/or other electromagnet coils utilized to supplement the nominally static main magnetic field $B_o$ of a main magnet structure.

This invention may be considered as generally related to at least the following prior, commonly assigned, U.S. patents and/or patent applications:

1. U.S. Pat. No. 4,755,755 issued Jul. 5, 1988 to Carlson entitled "Compact Transverse Magnetic Gradient Coils and Dimensioning Method Therefor";
2. U.S. Pat. No. 4,829,252—Kaufman issued May 9, 1989 entitled "MRI System With Open Access to Patient Image Volume";
3. U.S. Pat. No. 4,885,542—Yao et al, issued Dec. 5, 1989 entitled "MRI Compensated for Spurious NMR Frequency/Phase Shifts Caused by Spurious Changes in Magnetic Fields During NMR Data Measurement Processes";
4. U.S. Pat. No. 4,970,457—Kaufman et al issued Nov. 13, 1990 entitled "MRI Compensated for Spurious Rapid Variations and Static Magnetic Field During a Single MRI Sequence";
5. U.S. patent application Ser. No. 07/659,181 filed Feb. 22, 1991 now U.S. Pat. No. 5,157,330 by Kaufman et al entitled "Method and Apparatus For Compensating Magnetic Field Inhomogeneity Artifact in MRI";
6. U.S. patent application Ser. No. 07/702,428 now pending by Carlson et al filed May 20, 1991 (as a CIP of Ser. No., 07/688,131 filed Apr. 19, 1991 now pending which is, in turn a CIP of Ser. No. 07/686,622 filed Apr. 18, 1991 now pending) entitled "Apparatus and Method for Stabilizing the Background Magnetic Field During MRI"; and
7. U.S. patent application No. 07/705,964 now pending by Kaufman et al filed May 28, 1991 entitled "NMR Relaxometry Using Fixed RF Frequency Band."

The entire content of each of the above referenced related U.S. patents and patent applications is hereby incorporated by reference.

Magnetic resonance imaging systems are now commercially available from a number of sources. There are, in general, several techniques known to those in the art. Some exemplary MRI techniques are set forth, for example, in commonly assigned issued U.S. Pat. Nos. 4,297,637; 4,318,043; 4,471,305 and 4,599,565. The content of these issued patents is hereby incorporated by reference.

In all MRI systems now commonly used, a main magnet structure is used to provide a substantially uniform homogeneous magnetic field within a patient image volume along a predetermined axis (e.g., the z axis of the usual x,y,z orthogonal coordinate system). When precisely controlled gradient magnetic fields are superimposed within the image volume with respect to various different axes, the detectable NMR characteristics of NMR nuclei can be spatially encoded (in conjunction with suitable RF nutation pulses) so as to produce RF responses that can be detected and processed to provide two dimensional arrays of display pixel values (representing two and/or three dimensional depictions of NMR nuclei within the patient image volume). However, the accuracy of the MRI process is directly related to the degree of homogeneity in the static field and the degree of linearity in imposed gradient fields along the selected axes (the gradient field ideally being a linear function of position with respect to one axis and a constant as a function of position with respect to other orthogonal axes within the patient volume). To the degree that these desired goals of static field homogeneity and of gradient field linearity along precisely selected axes fail to be attained, then inaccuracies and/or artifacts in the resulting displayed image can be expected. Accordingly, considerable effort has been previously expended toward the ends of either attaining these goals or in correcting or compensating for deviations from such goals.

Some MRI systems have main magnet structures that include permanent magnets, iron and/or other ferromagnetic elements in the relevant main magnet magnetic circuit. For example, a relatively low field open architecture main magnet is employed in the MRI system design described by related U.S. Pat. No. 4,829,252 referenced above. In such structures, the ferromagnetic components exhibit remanent magnetization and hysteresis effects as a result of past magnetization history. This can cause a number of undesirable effects such as image distortion, intensity variations, artifacts of various sorts, etc. Superconducting magnets may also include iron flux return elements exhibiting hysteresis.

Remanent magnetization and hysteresis effects are especially troublesome with with respect to the rapid sequentially changing energization of gradient electromagnet coils. For example, the usual phase encoding gradient coils (e.g., oriented to produce a gradient in the y axis dimension) typically are sequenced in 256 steps from a drive pulse of maximum positive value to a maximum negative value (e.g., over 256 successive MRI data gathering cycles). The first large pulse will leave a relatively large remanent magnetization throughout the next 127 successively smaller magnitude positive drive pulses. However, as the drive pulse polarity reverses, the remanent gradient will also be caused to be reversed and will then stepwise increase in magnitude throughout the remainder of the complete imaging sequence to a maximum negative value. Furthermore, even for gradient axes which do not change in magnitude or polarity during the entire imaging sequence (e.g., as along the x axis which is typically energized during NMR RF signal readout), a remanent gradient of some sort will remain to possibly distort a subsequent imaging sequence.

Ambient or other environmental changes can also cause undesirable changes in the magnetic field of an MRI system. For example: local changes in the earth's magnetic field or local magnetic field changes induced by local movements of large magnetically permeable masses (e.g., elevators, locomotives, etc) by the passage of large local electrical currents and their associated magnetic fields (e.g., as in the drive circuits of elevators, trolley cars, trains, subways, etc.), by ambient temperature changes and related changes in magnetic circuit properties, hysteresis effects in magnetically coupled bodies. These are all potential sources of undesired deviations from the optimum spatial distribution of magnetic field orientation and strength within the patient image volume of an MRI system throughout any given imaging procedure—or over the historical period of system installation at a given site or ambient conditions as compared between different sites. The latter may impair the ability to accurately compare images taken at the same site at widely separated intervals of time.

Currently substantial efforts are required during installation of an MRI system at a particular site in an attempt to minimize such difficulties. Extra care must currently also be taken to assure quality and repeatability in magnet production for MRI systems. Many special processing steps or other precautions are often also required to provide reliability and image quality with sufficiently high standards in view of these ongoing problems. Accordingly, there is considerable need for a more comprehensive and efficient technique to further minimize the possible adverse effects of such potential problems.

Other potential sources of similar problems are eddy currents generated by rapidly changing magnetic gradient fields in surrounding electrically conductive materials. Associated with each attempted change in the magnetic gradient flux will be the generation of eddy currents in any nearby unshielded conductors which, in conformance with Lenz's law, will produce magnetic fields which oppose the attempted change in the gradient field. Accordingly, it has long been known that some kind of eddy current compensation must be included in the drive current supplied to a gradient coil.

In other words, consistent, reliable operation of a magnetic resonance imaging system relies strongly on the creation of nearly ideal gradient flux pulses inside the volume to be imaged. Nearby electrically conductive structures inherently support eddy current loops when exposed to the rapidly switched gradient fields and these result in various distortions to the desired spatial distribution of magnetic flux. Such eddy currents, located in various nearby metallic structures, decay in a manner that is characteristic of a collection of somewhat different exponential time constants. If not compensated, the related time variation produced in the net magnetic flux actually present within the patient image volume would be sufficiently severe to distort section profile and end-plane resolution of the imaging system.

As a consequence, magnetic resonance images have long used some kind of compensation to reduce the effect of such secondary "eddy" currents. The most common prior technique is an open loop feedback system whereby the gradient flux demand pulse is purposely initially overdriven (e.g., "pre-emphasized" in a predetermined and pre-calibrated wave form). Determining the exact characteristics of such overdriving for a particular installation site presently requires a considerable and lengthy effort. One prior approach towards automation of this process is set forth in U.S. Pat. No. 4,928,063, dated May 22, 1990, entitled "Automatic Eddy Current Correction" naming David L. Lampman et al as inventors. Hopefully, once this laborious process has been completed, the open loop control system will overdrive the gradient coil in just the right manner to thereafter anticipate all induced eddy currents and to result in a net actual flux field that approximates the ideal.

However, not only does this kind of conventional system setup consume considerable time initially (and thereafter in a maintenance mode), it is virtually impossible to find one predetermined overdrive specification that will properly compensate for eddy currents under all subsequent changing operational conditions. For example, if the magnet structure is a cryogenic superconducting magnet then, as the cryogen boils off, the temperature of various metallic conductor elements varies which, in turn, causes a significant change in resistivity and a noticeable change in the time response of eddy current subsystems. Future magnet designs may eliminate the baths of cryogens and rely on continuous cooling by external refrigerators. Such designs may have intrinsically larger variations in eddy current behavior with the cycling of the refrigerator.

Furthermore, spatial variations in eddy current fields often do not exactly track the gradient coil flux field. The additional current needed to compensate for eddy currents is a priori dependent on spatial position. Therefore, one cannot successfully completely eliminate eddy current effects in an entire region of space by the open loop compensation of a single coil.

In short, it is virtually impossible for a simple open loop compensation system to exactly correct for eddy current effects. A typical overdrive compensation involves a current overshoot of approximately 20% with a decay to an asymptotic "steady state" value involving two or three time constants—plus a similar undershoot when the drive pulse turns "off," and with a similar multi-time constant decay to the asymptotic current state.

A less common but somewhat better technique for reducing adverse eddy current effects is to wind a shield coil around the gradient coils. Although this may substantially eliminate the effect of some eddy currents (e.g., those induced in the aluminum cryogenic container), it occupies a considerable additional portion of the available magnet bore space thus substantially decreasing access to the image volume while adding substantial cost, weight, etc to the overall MRI system.

As a part of the lengthy setup procedure now required for installation of an MRI system at a particular site, considerable effort is often given to centering the gradient coils in an attempt to avoid asymmetric eddy current effects. If the eddy currents are substantially asymmetric, then there may be no technique known in the prior art for adequately compensating them.

SUMMARY OF THE INVENTION

We have now discovered several improvements for gradient drive control circuits in magnetic resonance imaging systems which substantially alleviate or at least improve many of the above-mentioned problems. In brief summary, a closed-loop real-time feedback control is provided for the gradient coil (and perhaps similar other coil) drivers in an MRI system. The net actual gradient flux (e.g., including hysteresis and eddy current effects) is monitored during the imaging procedure on a real-time basis. The sensed net flux input is then presented to an integral feedback controller for each coil control channel so as to modulate the coil drive current pulse as needed, on a real-time basis, to maintain whatever desired constant gradient value is then demanded from the main MRI system control (e.g., typically a fixed gradient pulse magnitude and polarity for a given length of time).

The flux monitoring coils are, in one presently preferred embodiment, patterned after the gradient coils. For example, properly oriented sets of "saddle" coils of the Golay variety, Helmholtz and/or Maxwell coil configurations (e.g., see related U.S. Pat. No. 4,755,755—Carlson referenced above) may be used in a solenoidal geometry typical for cryogenic superconducting magnets. Pancake D-shaped and circular gradient coils may be used for typical open-architecture permanent magnet structures (e.g., see related U.S. Pat. No. 4,829,252—Kaufman cited above). The gradient flux sensing coils must, of course, be located and/or dimensioned so as to occupy a different physical volume than the actual gradient flux generating coils.

For a solenoidal cryogenic superconducting magnet structure, the gradient flux sensing coils may preferably have a slightly reduced radius as compared to the gradient flux generating coils so that the flux sensing coils may be closely located just inside the usual gradient coil structure. It should be noted that in presently preferred exemplary embodiments, typically only a single turn is utilized for each of the flux sensing coils. Since the conductor of the single turn flux sensing coil does not need to pass heavy currents, a very small conductor cross-section may be used (e.g., 0.010 to 0.020 inch by 0.25 to 0.5 inch copper strip may be used). Thus, only a slight further incursion is necessitated into the magnet bore space and no substantial further restriction on patient image volume or access to same is necessitated. That is, the flux sensing coils may, in this embodiment, be located outside the patient image volume.

To obtain proper balance between the various mutual inductances (e.g., magnetic coupling) between the flux sensing coils and the flux generating coils on the one hand and the eddy current/hysteresis flux on the other hand, it may be necessary to slightly adjust the flux sensing coils with respect to the flux generating coils (thereby somewhat increasing or decreasing the mutual inductance between these two sets of coils). Mutual inductance in a typical superconducting geometry may be adjusted by varying the size and/or placement of the sensor loop along the axis of the cylinder.

Although the preferred exemplary embodiment utilizes flux sensing coils which are a substantial replica of the gradient flux generating coils (insofar as the locus of winding conductors is concerned), the net magnetic flux within the patient imaging volume may be monitored by other sensing arrangements. For example, arrayed Hall effect probes, flux gate magnetometers, conventional pickup loops, etc., may be strategically located with outputs appropriately combined so as to detect changes along a given axis from an initial or desired magnetic flux state. Besides being placed around the perimeter other possibilities include using an array of small pickup loops in an unobtrusive location inside the patient region, for example, mounted inside the patient bed.

As should be now apparent, such a closed loop real time control system may also provide substantial correction for changing gradient fields induced by environmental disturbances or the like. Furthermore, the closed loop feedback system compensates for ongoing changes in the magnet structure (e.g., as a function of cryogen boil-off, ambient temperature changes, ambient magnetic field changes, etc). By decreasing the need for gradient coil driver adjustments and by reducing the exactness of required gradient coil centering during initial MRI systems setup, not only is system performance materially improved (e.g., by maintaining accurate eddy current compensation even if magnet drift or change in amplifier characteristics, etc.) but significant cost reductions may also result. Furthermore, spatial non-uniformities of eddy current distributions may be compensated.

Typical MRI systems may also include a Helmholtz coil pair to make minor adjustments in the "uniform" field. The closed loop real-time feedback control system of this invention can also be used advantageously to control such "uniform" field coils or other electromagnet coils used in the MRI system (e.g., so as to reduce time dependent anomalies). Although there is no intrinsic reason that closed loop feedback will eliminate the need for gradient coil centering, the additional uniform field channel provides another dimension of controlled compensation. To a reasonable approximation, a gradient coil which is placed too low in the main magnet appears to produce a gradient field along the y dimension and an eddy current field which is the sum of a uniform component and a gradient component along y. However, since there is also a uniform field sensor, this component can also be measured and corrected for this contamination by suitably driving the uniform field driver.

In the presently preferred exemplary embodiments, the analog flux sensing signal is converted to digital form for each of the electromagnet coils that is to be separately controlled. A shared digital signal processor (e.g., a properly programmed digital computer) may then be timed shared amongst the different control channels. The same digital signal processor receives digital flux demand signals from the MRI system control computer (e.g., requesting the generation of a uniform or linear magnetic gradient flux within the patient image volume at a particular time and to be held constant until further instructed) is also supplied for each gradient control channel. The digital signal processor then compares the sensed actual net flux with the demanded flux and derives an appropriate feedback control signal (e.g., in accordance with a simple integral feedback control) so as to generate the needed input to the current supply source for the appropriate electromagnet coil. As will be appreciated, if such a real time closed loop feedback system has a sufficiently quick time response, it will automatically result in the "right" magnitude and time decay of overshoot when initiating a new flux gradient field and the "right" undershoot when terminating the flux gradient field pulse. Of course, an entirely analog flux-driven closed loop electromagnet driver control may also be used.

An extension of this method may use a series of flux sensors to monitor spatial inhomogeneities of the eddy current flux field. A set of smaller, higher order field coils, could then be driven in closed loop real time feedback fashion to remove the detected spatial non-uniformities of eddy current flux fields—thus achieving a higher degree of eddy current compensation over a larger volume. Alternatively, a set of such higher order compensation coils could be driven with an open loop drive based on earlier measured field inhomogeneities. This higher order compensation should also achieve a noticeable reduction in residual eddy current effects over a relatively large volume.

These as well as other objects and advantages of this invention will be more completely understood and appreciated by careful study of the following detailed description of presently preferred exemplary embodiments of this invention in conjunction with the accompanying drawings, of which:

DETAILED DESCRIPTION OF THE INVENTION

Figure 1:
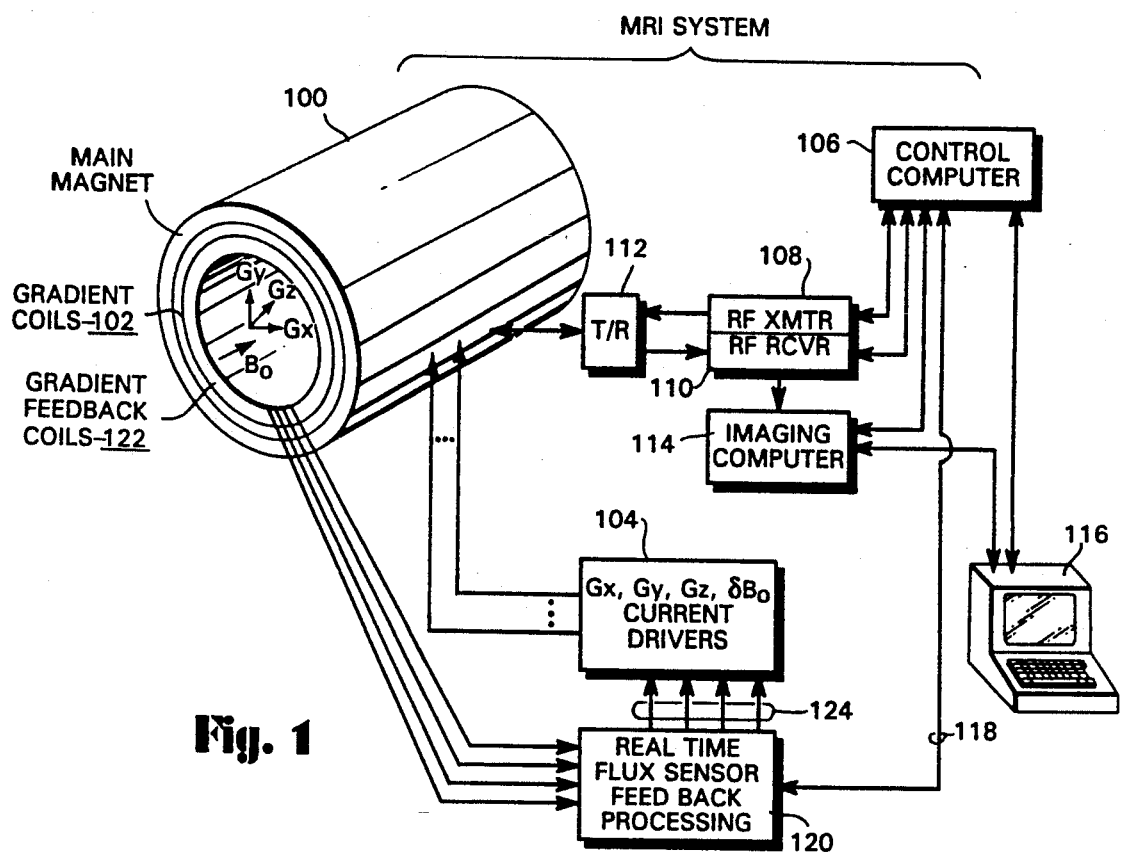
FIG. 1 is a simplified overall schematic diagram of an MRI system utilizing closed loop real time feedback control of gradient coil drivers in accordance with one aspect of this invention.

FIG. 1 schematically depicts a typical MRI system. In the magnet or "gantry" room, a main magnet 100 generates a nominally static, nominally uniform, magnetic field $B_o$ within a patient image volume. In the embodiment depicted at FIG. 1, the main magnet 100 is of a cylindrical solenoidal construction (e.g., a cryogenic superconducting solenoid). As those in the art will appreciate, other magnet configurations (e.g., including permanent magnet structures having opposing pole pieces above and below the patient image volume), are also conventionally known and may be used in typical MRI systems.

Between the main magnet structure 100 and the patient image volume are sets of gradient flux generating coils 102. Typically, coils are included for generating linear gradients in the static $B_o$ field along the usual orthogonal coordinate system x,y,z (e.g., gradient fields $G_x$, $G_y$, $G_z$). A so-called "uniform" flux generating coil may also be included to help calibrate the net effective magnetic flux field $B_o$ within the patient image volume. In FIG. 1 and elsewhere in this description, such a "uniform" field is denoted by the reference $\delta B_o$.

Figure 2A:
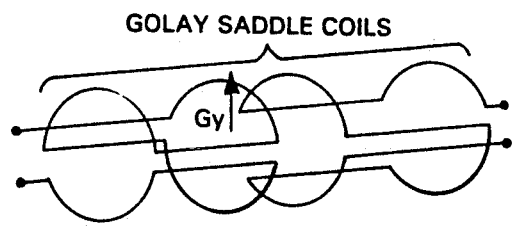
FIGS. 2A-2C are schematic depictions of various flux generating coils that are typically used in conjunction with a cryogenic superconducting solenoidal MRI magnet configuration.
Figure 2B:
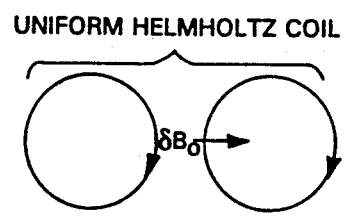
Figure 2C:
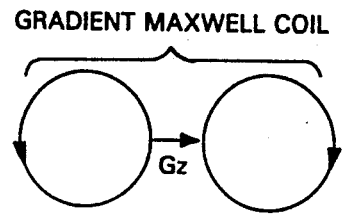

A schematic depiction of a typical set of saddle coils for generating $G_y$ is depicted at FIG. 2A. An identical set of saddle coils rotated by 90° is typically used to generate $G_x$. The gradient flux generating arc portions of these saddle coils actually comprise multiple turns of electrical conductors having substantial cross-section. The $G_x$ and $G_y$ saddle coils are typically contained within a common cylindrical insulating structure with the $G_z$ Maxwell coil (FIG. 2C) and $\delta B_o$ Helmholtz coil (FIG. 2B). The radial thickness of this composite cylindrical gradient coil structure may be on the order of 2 to 3 inches in typical installations.

Each of the $G_x$, $G_y$, $G_z$, $\delta B_o$ electromagnet coils is driven by its own controllable power supply source of electrical current. The controllable current drivers for each coil must be driven with precisely the right amount of current at precisely the right times to generate what is hopefully a substantially uniform or linear gradient flux field within the patient volume. The flux is hopefully turned "on" to a predetermined and desired magnitude at precisely the right time and then turned precisely "off" at another desired time or substantially instantaneously switched to a desired magnitude of reverse polarity current, etc. To this end, separately controllable $G_x$, $G_y$, $G_z$, and $\delta B_o$ gradient current drivers 104 are appropriately connected to their respective electromagnet coil sets 102 as depicted in FIG. 1.

The overall MRI process typically is controlled by a control computer 106 as depicted in FIG. 1. For example, the usual radio frequency transmitter 108 and receiver 110 communicate via T/R switch 112 with one or more RF coil structures closely coupled to the appropriate portion of a patient image volume. The NMR RF responses are typically amplified and digitally sampled before being provided to an imaging computer 114 (which is also under control of the system controller 106). After an appropriate MRI sequence has been completed (which may take several seconds or even minutes), all of the necessary image data will have been acquired and processed by imaging computer 114 so as to produce an appropriate image at the control console display 116 (or at other appropriate display or film recording peripheral devices as will be appreciated by those in the art). Typically, the control console 116 also includes a suitable keyboard for controlling the control computer 106 and, in turn, all of the other controllable aspects of the MRI procedure.

One aspect of the MRI procedure that has to be carefully controlled by the control computer 106 is the timed sequence of gradient flux pulses. Digital flux demand signals for each of the various electromagnetic gradient coils 102 is provided by control computer 106 on bus 118 to a real-time gradient flux sensor feedback processing computer 120. (Alternatively, the feedback processing computer 120 may be included as a part of the control computer 106 or may be effected by separate conventional analog feedback circuits.)

For example, at a desired point in an imaging sequence, the control computer 106 may send a digital demand on bus 118 for a predetermined magnitude of positive $G_y$ flux—which flux is to be maintained at a constant linear gradient value until further commanded or for some specified interval.

In the exemplary embodiment of FIG. 1, gradient feedback coils 122 are provided in a relatively thin composite cylinder structure located just inside the gradient coils 102. The flux sensing coils are, in this exemplary embodiment, located substantially outside the patient volume. In this exemplary embodiment, the pattern of each flux sensing coil replicates the pattern of its corresponding flux generating coil (e.g., saddle coil sets for $G_x$ and $G_y$, Helmholtz and Maxwell coil sets for $\delta B_o$ and $G_z$ flux fields, respectively). However, since only a single turn of relatively light-weight thin conductive strip is utilized for each flux sensing coil, the overall cylindrical package of feedback coils 122 need not occupy much additional space inside the main magnet 100.

The actual net sensed fluxes for $G_x$, $G_y$, $G_z$ and $\delta B_o$ are thus also presented as inputs to the real-time flux sensor feedback processing computer 120. These are each respectively compared to the appropriate flux demand signal provided by control computer 106 so as to generate the requisite error control outputs 124 to the current drivers 104—thus completing, in effect, four independent closed-loop real-time feedback control systems.

Figure 3:
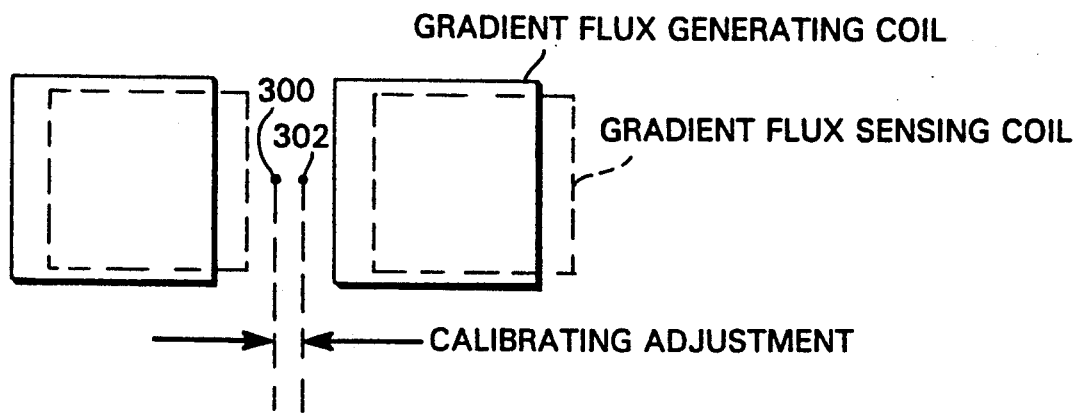
FIG. 3 is a schematic depiction of the calibrating adjustment between gradient flux generating coils and gradient flux sensing coils that may be required in some implementations of this invention.
Figure 4:
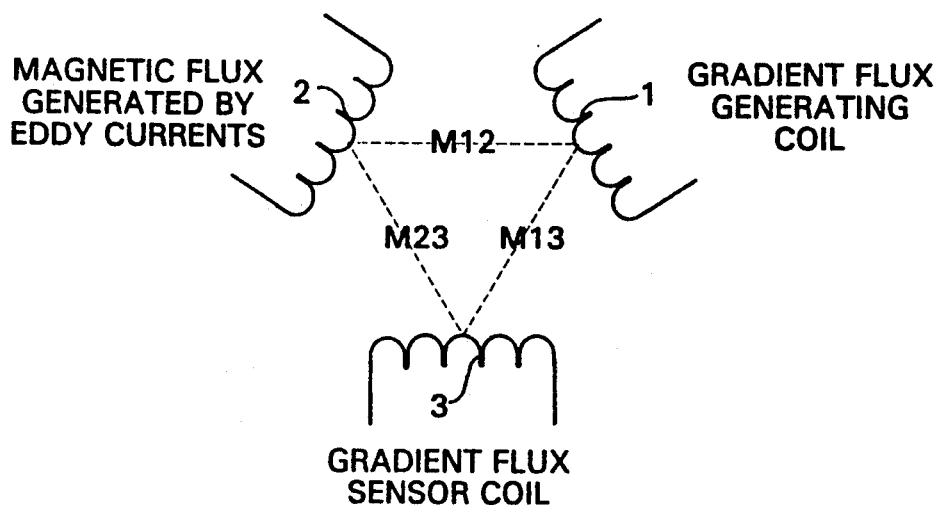
FIG. 4 is a schematic diagram useful in illustrating the mutual inductance and/or magnetic coupling between the gradient flux sensor coil and the gradient flux generating coil on the one hand and the magnetic flux generated by eddy currents on the other hand.

As schematically depicted in FIG. 4, a given flux sensing coil 3 will have mutual inductance (e.g., magnetic coupling) to its respective flux generating coil 1 and to the magnetic flux generated by eddy currents 2. If the mutual coupling between these three elements is not properly balanced, then the feedback control may not be properly calibrated (e.g., it may consistently produce slightly less or slightly more actual net magnetic flux than is currently being demanded by the control computer 106). For example, the mutual coupling $M_{13}$ may be stronger than the mutual coupling $M_{23}$ if the flux sensing coil 3 is exactly aligned with the flux generating coil 1. In recent experiments utilizing only y-gradient feedback control, it was noted for example that when the center of the flux sensing coils was axially coincident with the center of the flux generating coil, the actual net generated flux was consistently about 4% less than demanded by the control computer. However, (as depicted in FIG. 3) it was discovered that by slightly reducing the mutual coupling $M_{13}$ (e.g., by providing a calibrating offset between the center 300 of the flux generating coils and the center 302 of the flux sensing coils (e.g., of about 2 inches) the relative mutual inductances in the system could be appropriately balanced so as to cause the closed-loop real-time feedback control system to accurately and consistently produce substantially exactly the net flux field being demanded at any given time by the control computer 106.

If distributed gradient coil structures are utilized, the mutual coupling to flux sensing coils may be inherently balanced with respect to the eddy current surfaces so as not to require such a calibrating adjustment. Preferably, if the mutual inductances are not balanced, the shape and/or location of the flux sensor loop can be modified so as to provide balanced inductances. The best way to modify the sensor depends on specific details of the gradient coil design and may involve trial and error modification. Of course it should be possible to achieve calibration by simply causing the control computer 106 to generate the flux demand signal with compensation for such a consistent excess or deficiency if the mutual inductance between the various portions of the relevant magnetic circuits are not properly balanced.

Figure 5:
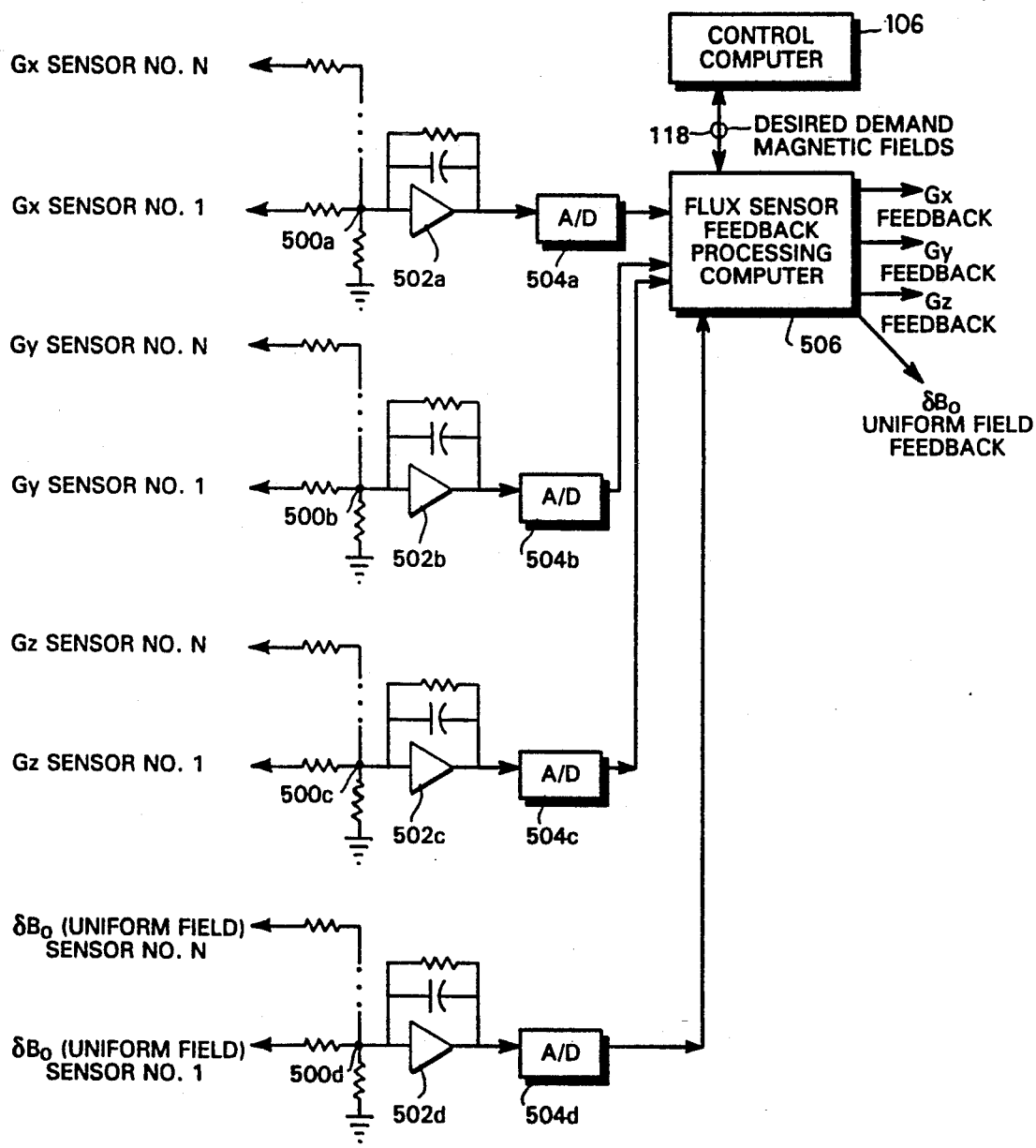
FIG. 5 is a simplified schematic diagram of a plural channel closed-loop real-time feedback control for a gradient driver system in a typical MRI system in accordance with this invention.

A somewhat more detailed exemplary schematic diagram of a real-time flux sensor feedback processing circuit 120 is depicted at FIG. 5. Here, there is a separate input processing channel for each of the flux generating electromagnet coil sets (e.g., $G_x$, $G_y$, $G_z$ and $\delta B_o$) Although in the exemplary embodiment only a single flux sensing coil is utilized for each channel, as noted above, alternate embodiments may utilize additional flux sensing coils with their analog outputs combined with appropriate weighting at summing nodes 500a-500d, respectively. Suitable impedance isolation and/or amplification is provided in each channel by buffer amplifiers 502a-502d, respectively. The analog signals in each channel are then converted to digital form by A-D converters 504a-504d, respectively, before being presented as inputs to a feedback processing computer 506. As will be appreciated, the processing computer 506 may include four digital signal input ports with associated latches so that the current digital signal value from any given processing channel is always available for programmed processing. The feedback processing computer 506 also receives magnetic flux field demand signals from control computer 106. As will be appreciated by those in the art, control computer 106 may use interrupt processing or the like to update appropriate demand control variables in the processing computer 506 whenever a different flux demand for any given channel is to be made. The feedback processing computer 506 acts on a time-shared basis to independently control all four closed-loop feedback channels and to provide appropriate digital feedback error output signals for the $G_x$, $G_y$, $G_z$ and $\delta B_o$ channels at four output ports as depicted on the right-hand side of FIG. 5.

To achieve proper closed-loop feedback control system operation, it is estimated that approximately 20 or so sample points are required for each pulse rise and fall time. Since the sample control loops are used to control magnetic flux changes having desired time constants on the order of 1 millisecond, this implies the need to supply approximately 1 sample every 50 microseconds (per channel) to obtain sufficiently fast response times. Although this may be achievable with sufficiently fast digital processing circuits, the use of the analog "front end" comprising op-amp integration circuits 502a-502d may be utilized to initially capture the signal and then permit a somewhat slower sampling frequency (e.g., one sample every 200 microseconds per channel) and still obtain sufficiently rapid response times. In effect, the analog front-end includes low pass filtering characteristics.

Figure 6:
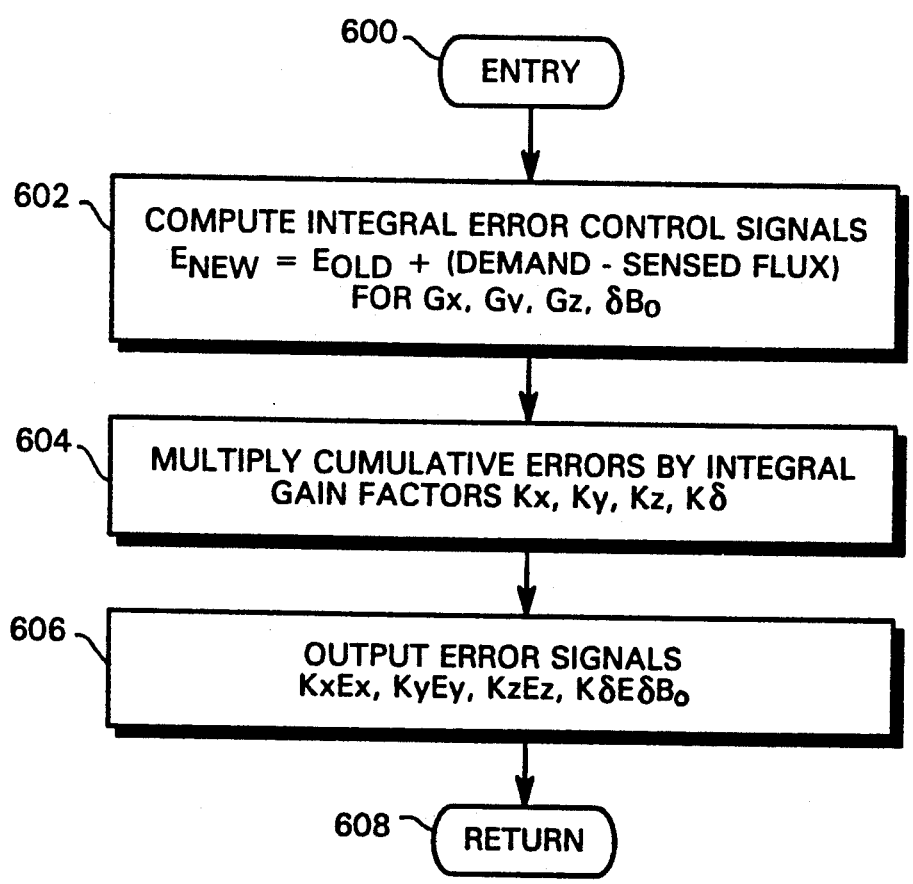
FIG. 6 is a simplified flow diagram of one possible program for the digital signal processor or feedback processing computer of FIG. 5.

Although many different kinds of digital processing computers 506 may be used with many different kinds of programs, a relatively simple integral feedback controller process is preferably used in the exemplary embodiment for each of the control channels. For example, as schematically depicted in FIG. 6, the control process may be entered at 600. An integral (i.e. cumulative) error control signal E may be computed at 602 for any one or all of the feedback control loops. As will be appreciated, the accumulated error signals are typically multiplied at 604 by an integral gain factor (e.g., $K_x, K_y, K_z, K_\delta$) before sending an output to the controlled feedback amplifier. In some conventional adaptive controllers, such gain factor(s) K are not constant but are "learned" by the controller. In the exemplary embodiment, control is then passed directly to block 606 where the computed cumulative error signals are output to a conventional gradient coil drive controller 104 (e.g., see FIGURE 7) before the subroutine is exited at 608.

Figure 7:
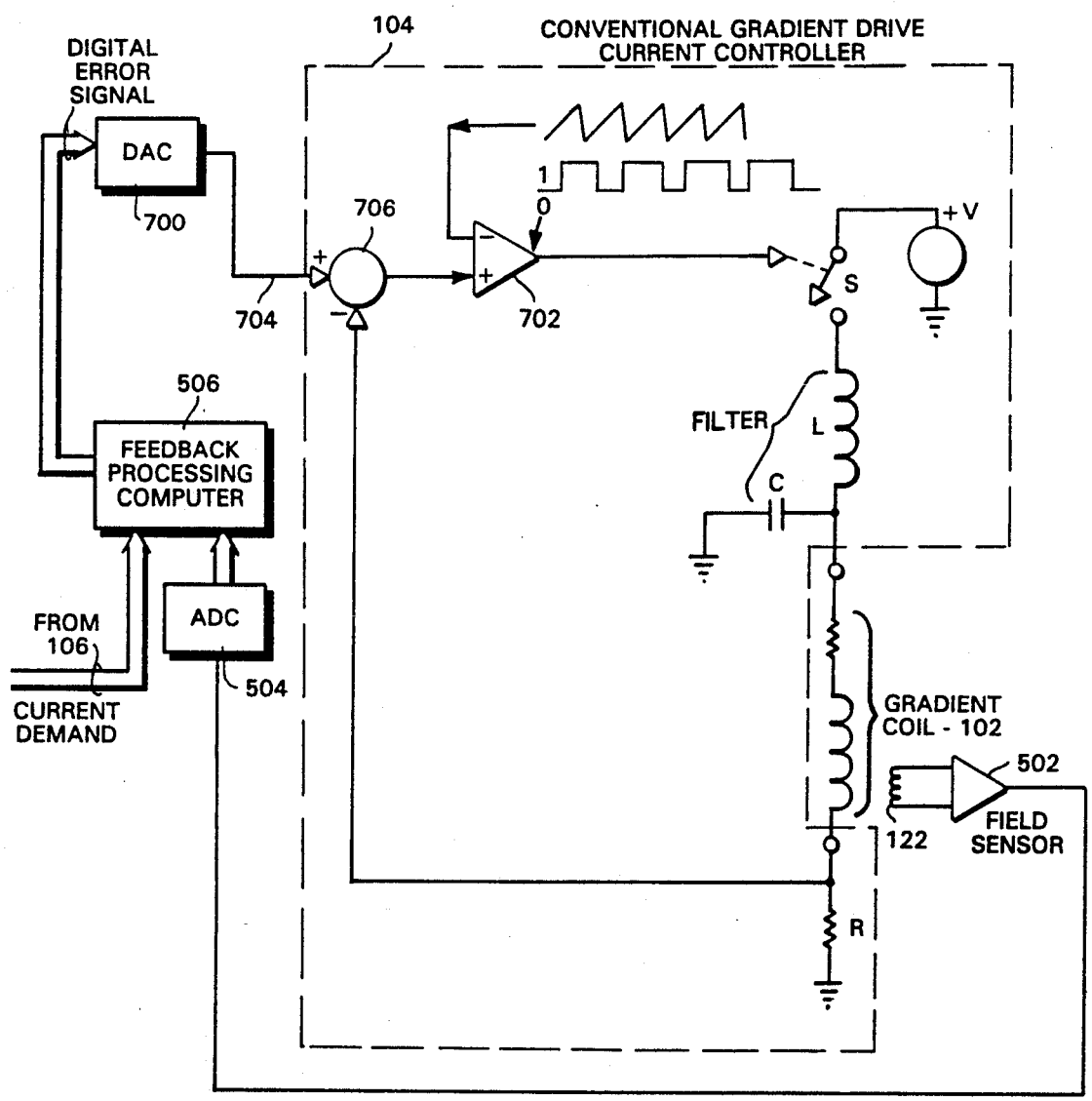
FIG. 7 is a schematic depiction for one closed-loop real-time gradient coil feedback control channel in accordance with this invention utilizing a conventional gradient controller.

FIG. 7 depicts an exemplary embodiment wherein the digital error signal for a given channel (e.g., $G_y$) produced by feedback processing computer 506 is converted to analog form by digital to analog converter 700 before input to a conventional gradient drive current controller 104. The conventional driver 104 operates its output switch S at a constant frequency and variable duty cycle. For bipolar drive currents, the comparator 702 and output circuitry are more complex but the unipolar example in FIG. 7 conveys the requisite concepts for those of skill in this art.

Here, the analog current demand input at 704 and the sensed current (e.g., corresponding to the voltage drop across current sensing resistor R connected in series with the gradient coil 102 (including an inductance and distributed resistance) are differenced at 706 and presented to the non-inverting input of comparator 702. A constant frequency saw tooth wave is applied to the inverting input of comparator 702. When the input difference between the demanded current and the sensed current exceeds the saw tooth wave, comparator 702 turns "on" thus controlling output switch S so as to connect a positive voltage supply V to drive the gradient coil 102 via the usual LC filter as also depicted in FIG. 7. As the output current rises to match the demand, the duty cycle for switch S decreases in accordance with the sensed current feedback. In other words, the output pulse width varies with demand as schematically indicated in FIG. 7. Other kinds of analog output control circuits may also be used in conventional gradient drive current controllers 104 (e.g., constant pulse width but variable frequency, variable frequency, etc).

As can be seen, this conventional gradient drive controller 104 (with its included current driven closed feedback loop) becomes part of the flux-driven closed feedback loop of this invention. As previously noted, although the exemplary embodiment uses a hybrid analog/digital/analog flux-driven closed feedback loop, a completely analog or a digital circuit can be used if desired.

The exemplary embodiments may also be usefully modified to include a "feed forward" component to coil drivers. That is, the input to the coil drive amplifiers/controllers 104 may be the sum of two components: (1) the conventional commonly used open-loop overdrive component and (2) the closed loop feedback error signal. We presently believe this modification may be better able to deliver high frequency response to the gradient coils. Without this modification, if the digital system only samples and updates at a relatively slow rate (e.g., every 200 microseconds), the asynchronously occurring gradient pulse edges can result in a dither (e.g., at up to 200 microsecond intervals) of the starting and ending times for actual gradient drive pulses. The conventional analog overdrive system does not have this potential transient problem. Thus, by using the conventional existing system as a feed forward component, one can get the gradient pulse edges properly defined in the time domain. The closed loop feedback response provided by this invention is more important for obtaining improved relatively lower frequency system response.

This invention may also be used to drive additional electromagnetic coils that may be used to provide timed significant additions or subtractions from the nominally static background field B. Such $\Delta B_o$ electromagnets and their possible MRI applications are discussed in greater detail in related commonly assigned U.S. patent application Ser. No. 07/705,964 filed May 28, 1991 to Kafuman et al entitled "NMR Relaxometry Using Fixed RF Frequency Band."

Although only a few specific exemplary embodiments of this invention have been described in detail above, those skilled in the art will recognize that many variations and modifications may be made in these exemplary embodiments while yet retaining many of the novel features and advantages of this invention. Accordingly, all such modifications and variations are intended to be included within the scope of the appended claims.

What is claimed is:

1. A magnetic resonance imaging system comprising a main magnet, at least one electromagnet coil, at least one RF coil, coupled to RF transmit and receive circuits and an MRI system controller and further comprising:
    at least one real time closed-loop feedback control circuit connected to control the current supplied to said at least one electromagnet coil during an MR imaging process in response to sensed flux produced by said electromagnet coil and a supplied flux demand signal.

2. A magnetic resonance imaging system gradient coil drive circuit comprising:
    a gradient flux sensing coil producing a sensed flux signal corresponding to flux produced by a respectively corresponding gradient coil; and
    a closed loop feedback control circuit connected to supply current to said gradient coil during an MR imaging process as a function of said sensed flux signal and a supplied demand flux signal.

3. In a magnetic resonance imaging system having a main magnet producing a static field $B_o$ and at least one electromagnet gradient coil for superimposing a gradient magnetic field onto said static field along a predetermined axis in response to a supplied flux demand signal an improvement comprising:
    at least one gradient flux sensing coil disposed to sense the net gradient flux being produced by said gradient coil and to produce a corresponding electrical output; and
    a real time feedback control circuit coupled to compare said electrical output from said flux sensing coil with said supplied flux demand signal and to generate, in substantially real time, an electrical drive current to said gradient coil which is required to produce a sensed gradient flux substantially equal to the predetermined desired gradient flux represented by said flux demand signal.

4. An improved magnetic resonance imaging system as in claim 3 wherein said main magnet comprises a magnet with ferromagnetic elements exhibiting significant magnetic hysteresis effects in response to changing magnetic gradient fields.

5. An improved magnetic resonance imaging system as in claim 3 wherein said main magnet comprises a magnet structure producing significant eddy currents in response to rapidly changing magnetic gradient fields.

6. An improved magnetic resonance imaging system as in claim 3 wherein said gradient flux sensing coil is located outside the patient imaging volume of said imaging system.

7. An improved magnetic resonance imaging system as in claim 3 wherein:
    said gradient flux sensing coil includes at least one conductor turn following substantially the same geometrical path as said gradient coil, but at a different distance from the center of the magnetic resonance imaging system.

8. An improved magnetic resonance imaging system as in claim 6 or 7 wherein the gradient coil and flux sensing coil are disposed within cylindrical shells and wherein said gradient flux sensing coil is of smaller radius than the gradient coil.

9. An improved magnetic resonance imaging system as in claim 6 or 7 wherein the size and position of said gradient flux sensing coil center provide substantially equal mutual inductance between the gradient coil-flux sensor pair and the eddy current-flux sensor pair.

10. An improved magnetic resonance imaging system as in claim 3 comprising plural gradient coils, each gradient coil having a corresponding gradient flux sensing coil and real time closed loop feedback control circuit.

11. An improved magnetic resonance imaging system as in claim 3 further comprising a uniform field coil which also has an associated uniform flux sensing coil and real time closed loop feedback control circuit.

12. An improved magnetic resonance imaging system as in claim 3 wherein said feedback control circuit comprises:
an analog signal amplifier connected to receive the electrical output from said flux sensing coil and to produce a corresponding analog sensed flux signal;
an analog-to-digital converter coupled to receive said analog sensed flux signal and to produce a corresponding digital sensed flux signal;
a digital signal processor connected to receive a digital flux demand signal and said digital sensed flux signal and to compute a cumulative sum digital error signal from the difference between the two received input signals; and
a controlled current source connected to supply electrical current to said gradient coil in response to said digital error signal.

13. An improved magnetic resonance imaging system as in claim 10 comprising plural gradient coils, each gradient coil having a corresponding gradient flux sensing coil and real time closed loop feedback control circuit wherein each closed loop feedback control circuit time shares a common digital signal processor.

14. An improved magnetic resonance imaging system as in claim 12 or 13 wherein each said controlled current source includes a digital-to-analog converter for converting its respective digital error signal to a corresponding analog error signal and an analog current control loop to control the drive current supplied to its gradient coil.

15. In a magnetic resonance imaging system having a main magnet producing a static field $B_o$ and at least one electromagnet gradient coil for superimposing a gradient magnetic field onto said static field along a predetermined axis in response to a supplied flux demand signal, an improvement comprising:
sense means for sensing the gradient coil magnetic flux and for producing an analog sensed flux signal corresponding thereto;
an analog to digital converter connected to convert said analog sense signal to a corresponding digital sensed flux signal;
a digital signal processor connected to receive said digital sensed flux signal and a digital flux demand signal, to compare said received signals and to generate a digital output signal representing the instantaneous current magnitude to be supplied to said gradient coil so as to generate a gradient flux corresponding to said flux demand; and
a switchable current source connected to be switched responsive to said digital output signal.

16. An improved magnetic resonance imaging system as in claim 15 wherein said sense means is disposed outside the patient imaging volume of said imaging system.

17. An improved magnetic resonance imaging system as in claim 15 wherein said sense means includes a gradient flux sensing coil disposed to sense the net gradient flux actually produced by said gradient coil.

18. An improved magnetic resonance imaging system as in claim 15, 16 or 17 wherein said main magnet comprises a ferromagnetic material exhibiting significant magnetic hysteresis effects in response to rapidly changing magnetic gradient fields.

19. An improved magnetic resonance imaging system as in claim 15, 16 or 17 wherein said main magnet comprises a magnetic structure producing significant eddy currents in response to rapidly changing magnetic gradient fields.

20. An improved magnetic resonance imaging system as in claim 15, 16 or 17 comprising plural gradient coils, each gradient coil having a corresponding sense means and switched current source.

21. An improved magnetic resonance imaging system as in claim 20 wherein a common digital signal processor is time-shared by the sense means and switched current sources.

22. A magnetic resonance imaging method utilizing a main magnet, at least one electromagnet coil, at least one RF coil, coupled to RF transmit and receive circuits and an MRI system controller and comprising:
controlling the current supplied to said at least one electromagnet coil during an MR imaging process in response to sensed gradient flux and a flux demand signal.

23. A method for driving a magnetic resonance imaging system gradient coil comprising:
sensing gradient flux produced by a gradient coil; and
using a closed loop feedback control circuit during an MR imaging process to supply current to the gradient coil as a function of the sensed flux and a supplied demand flux signal.

24. In a magnetic resonance imaging method using a main magnet producing a static field $B_o$ and at least one electromagnet gradient coil for superimposing a gradient magnetic field onto said static field along a predetermined axis in response to a supplied flux demand signal an improvement comprising:
sensing the net gradient flux being produced by a gradient coil and producing a corresponding electrical output; and
comparing said electrical output with said supplied flux demand signal and generating in substantially real time, an electrical drive current to said gradient coil which is required to produce a sensed gradient flux substantially equal to the predetermined desired gradient flux represented by said flux demand signal.

25. An improved magnetic resonance imaging method as in claim 24 wherein said main magnet comprises a ferromagnetic material exhibiting significant magnetic hysteresis effects in response to rapidly changing magnetic gradient fields.

26. An improved magnetic resonance imaging method as in claim 23 wherein said main magnet comprises a magnet structure producing significant eddy currents in response to rapidly changing magnetic gradient fields.

27. An improved magnetic resonance imaging method as in claim 24 wherein:
said gradient flux is sensed using a sensing coil having at least one conductor turn following substantially the same geometrical path as said gradient coil, but at a different distance from the center of the magnetic resonance imaging system.

28. An improved magnetic resonance imaging method as in claim 27 wherein the gradient coil and flux sensing coil are disposed within cylindrical shells and wherein said gradient flux sensing coil is of smaller radius than the gradient coil.

29. An improved magnetic resonance imaging method as in claim 27 further comprising adjusting the disposition of of said gradient flux sensing coil to balance the mutual inductance between it, said gradient coil and eddy current flux and thus to calibrate the electrical output of the flux sensing coil to better represent the net gradient flux actually being produced in the magnetic resonance imaging system.

30. An improved magnetic resonance imaging method as in claim 24 comprising controlling plural gradient coils, each gradient coil control using a corresponding gradient flux sensing coil and real time closed loop feedback control circuit.

31. In a magnetic resonance imaging method using a main magnet producing a static field $B_0$ and at least one electromagnet gradient coil for superimposing a gradient magnetic field onto said static field along a predetermined axis in response to a supplied flux demand signal, an improvement comprising:

sensing the gradient coil magnetic flux and producing an analog sensed flux signal corresponding thereto;

converting said analog sense signal to a corresponding digital sensed flux signal;

comparing said digital sensed flux signal to a digital flux demand signal and generating a digital output signal representing the instantaneous current magnitude to be supplied to said gradient coil so as to generate a gradient flux corresponding to said flux demand; and controlling a switchable current source connected to drive said gradient coil responsive to said digital output signal.

* * * * *